US012573450B2

(12) United States Patent

Singh et al.

(10) Patent No.: US 12,573,450 B2
(45) Date of Patent: Mar. 10, 2026

(54) SRAM COLUMN SLEEP CIRCUITS FOR LEAKAGE SAVINGS WITH RAPID WAKE

(71) Applicants: Advanced Micro Devices, Inc., Santa Clara, CA (US); ATI Technologies ULC, Markham (CA)

(72) Inventors: Sahilpreet Singh, Markham (CA); Peter Louiz Rezk Beshay, Austin, TX (US); Russell Schreiber, Austin, TX (US)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 104 days.

(21) Appl. No.: 18/059,360

(22) Filed: Nov. 28, 2022

(65) Prior Publication Data

US 2024/0176514 A1 May 30, 2024

(51) Int. Cl.
| | |
|---|---|
| *G11C 11/41* | (2006.01) |
| *G06F 3/06* | (2006.01) |
| *G11C 7/12* | (2006.01) |
| *G11C 11/413* | (2006.01) |

(52) U.S. Cl.
CPC .......... *G11C 11/413* (2013.01); *G06F 3/0611* (2013.01); *G06F 3/0625* (2013.01); *G06F 3/0634* (2013.01); *G06F 3/0673* (2013.01); *G11C 7/12* (2013.01)

(58) Field of Classification Search
CPC .... G06F 3/0625; G06F 3/0611; G06F 3/0634; G06F 3/0673; G11C 7/12; G11C 11/413
See application file for complete search history.

(56) References Cited

U.S. PATENT DOCUMENTS

| | | | | |
|---|---|---|---|---|
| 5,933,373 A | * | 8/1999 | Takahashi | G11C 7/12 |
| | | | | 365/204 |
| 6,801,463 B2 | | 10/2004 | Khellah et al. | |
| 7,499,310 B2 | * | 3/2009 | Park | G11C 7/12 |
| | | | | 365/154 |
| 7,504,695 B2 | | 3/2009 | Martelloni et al. | |
| 7,619,916 B2 | | 11/2009 | Goel | |
| 7,715,221 B2 | | 5/2010 | Christensen et al. | |
| 8,982,659 B2 | * | 3/2015 | Chang | G11C 5/141 |
| | | | | 365/207 |
| 9,685,224 B2 | * | 6/2017 | Yang | G11C 11/417 |

\* cited by examiner

*Primary Examiner* — Vanthu T Nguyen
(74) *Attorney, Agent, or Firm* — Kowert, Hood, Munyon, Rankin & Goetzel, P.C.; Rory D. Rankin

(57) ABSTRACT

An apparatus and method for efficiently designing memory arrays in semiconductor dies. In various implementations, a memory array utilizes wake pre-charge circuitry to reduce both leakage current and a transition from an idle state. When control circuitry of the memory array determines that there are no upcoming memory accesses, it disables bit line pre-charge circuitry of columns of the array. The control circuitry enables wake pre-charge circuitry to charge the bit lines to an idle voltage level equal to a difference between the power supply voltage level and a threshold voltage of a transistor. When the control circuitry determines a memory access is pending, the control circuitry transitions the memory array to an active state. Both the amount of voltage difference and the resulting latency to charge the bit lines from the idle voltage level to the power supply reference voltage level are small.

20 Claims, 10 Drawing Sheets

*Signal Waveforms 300*

Clock 310

Wake 118

BLPCX 126 and SAPCX 162

BLT 122, BLC 124 and SABLT 164, SABLC 166

VDD

Idle Voltage 320

VSS

Read Operation Pre-charge increases bit lines from (VDD – Vt) to VDD t1    t2    t3    t4

Time

Signal Waveforms
400

VDD

VSS

Time t1    t2    t3

Clock 410

BLPCX 126

BLT 122
and BLC 124

*Method*
*700*

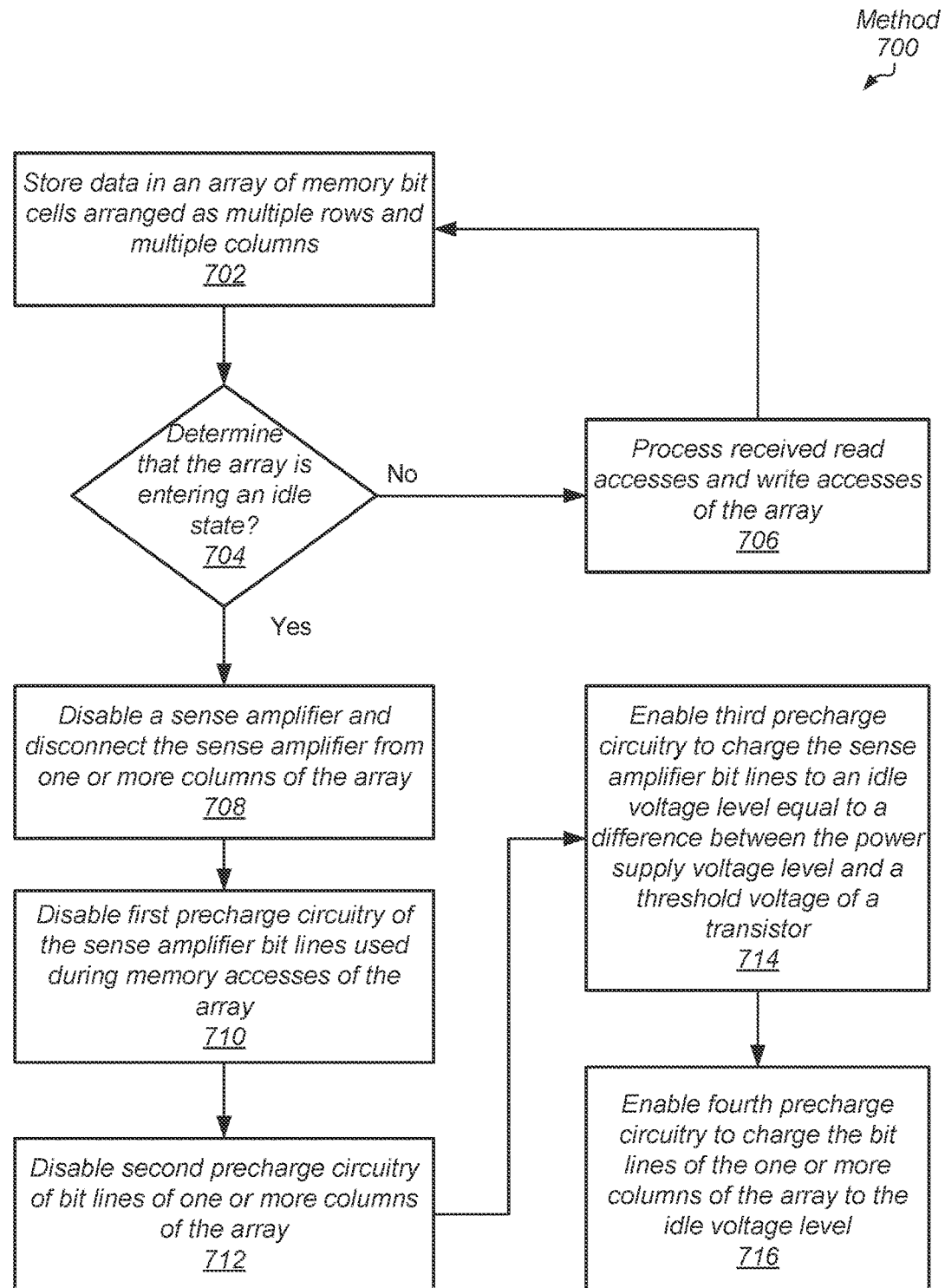

Store data in an array of memory bit cells arranged as multiple rows and multiple columns
702

Determine that the array is entering an idle state?
704

No → Process received read accesses and write accesses of the array
706

Yes

Disable a sense amplifier and disconnect the sense amplifier from one or more columns of the array
708

Disable first precharge circuitry of the sense amplifier bit lines used during memory accesses of the array
710

Disable second precharge circuitry of bit lines of one or more columns of the array
712

Enable third precharge circuitry to charge the sense amplifier bit lines to an idle voltage level equal to a difference between the power supply voltage level and a threshold voltage of a transistor
714

Enable fourth precharge circuitry to charge the bit lines of the one or more columns of the array to the idle voltage level
716

*FIG. 7*

*Method*
*800*

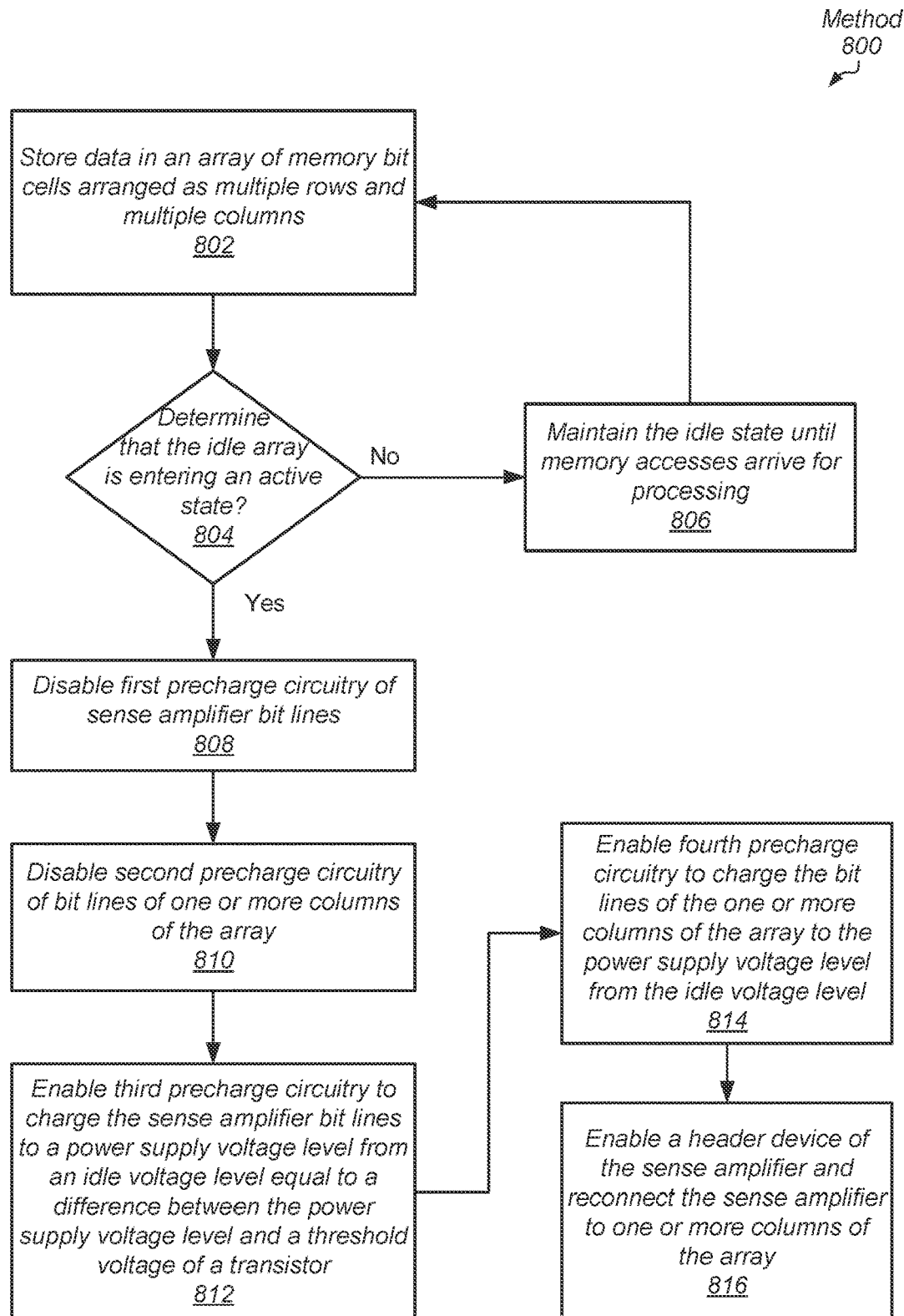

Store data in an array of memory bit cells arranged as multiple rows and multiple columns
802

Determine that the idle array is entering an active state?
804

No

Maintain the idle state until memory accesses arrive for processing
806

Yes

Disable first precharge circuitry of sense amplifier bit lines
808

Disable second precharge circuitry of bit lines of one or more columns of the array
810

Enable third precharge circuitry to charge the sense amplifier bit lines to a power supply voltage level from an idle voltage level equal to a difference between the power supply voltage level and a threshold voltage of a transistor
812

Enable fourth precharge circuitry to charge the bit lines of the one or more columns of the array to the power supply voltage level from the idle voltage level
814

Enable a header device of the sense amplifier and reconnect the sense amplifier to one or more columns of the array
816

*FIG. 8*

*Method*
*700*

Computing System
1000

SRAM COLUMN SLEEP CIRCUITS FOR LEAKAGE SAVINGS WITH RAPID WAKE

BACKGROUND

Description of the Relevant Art

Generally speaking, a variety of semiconductor chips include at least one processing unit coupled to a memory. The processing unit processes instructions (or commands) by fetching instructions and data, decoding instructions, executing instructions, and storing results. The processing unit sends memory access requests to the memory for fetching instructions, fetching data, and storing results of computations. Examples of the processing unit are a central processing unit (CPU), an application specific integrated circuit (ASIC), a field programmable gate array (FPGA), a multimedia engine, and a processing unit with a highly parallel microarchitecture such as a graphics processing unit (GPU) and a digital signa processor (DSP). In some designs, the processing unit and the memory are on a same die such as a system-on-a-chip (SOC), whereas, in other designs, the processing unit and the memory are on different dies within a same package such as a multi-chip-module (MCM) or in a system in a package (SiP). Static random-access memory (SRAM) is commonly used as the memory. The SRAM includes an array of many memory bit cells and surrounding circuitry used for accessing values stored in the array.

As both semiconductor manufacturing processes advance and on-die geometric dimensions reduce, semiconductor chips provide more functionality and performance while consuming less space. However, while many advances have been made, design issues still arise with modern techniques in processing and integrated circuit design that limit potential benefits. Some design issues include short channel effects of transistors. Both planar transistors and non-planar transistors are fabricated for use in integrated circuits within semiconductor chips. As the channel length of both types of transistors decreases, the threshold voltages of the transistors also decrease. When a gate terminal voltage received by a transistor is less than this small threshold voltage, an off-state current can still flow in the transistor. This off-state current is referred to as the leakage current. The leakage current can remove a charge on a drain terminal of the transistor.

Flowing leakage current additionally increases power consumption since disabled transistors still conduct a non-zero amount of current. The power consumption of integrated circuits has become an increasing design issue with each generation of semiconductor chips. As power consumption increases, more costly cooling systems such as larger fans and heat sinks must be utilized in order to remove excess heat and prevent integrated circuit failure. However, cooling systems increase system costs. The integrated circuit power dissipation constraint is not only an issue for portable computers and mobile communication devices, but also for desktop computers and servers utilizing high-performance microprocessors.

In view of the above, methods and systems for efficiently designing memory arrays in semiconductor dies are desired.

BRIEF DESCRIPTION OF THE DRAWINGS

FIG. 7 is a generalized block diagram is shown of a method for efficiently reducing, in a memory array, both leakage current and a transition from an idle state.

FIG. 8 is a generalized block diagram is shown of a method for efficiently reducing, in a memory array, both leakage current and a transition from an idle state.

Figure 1:
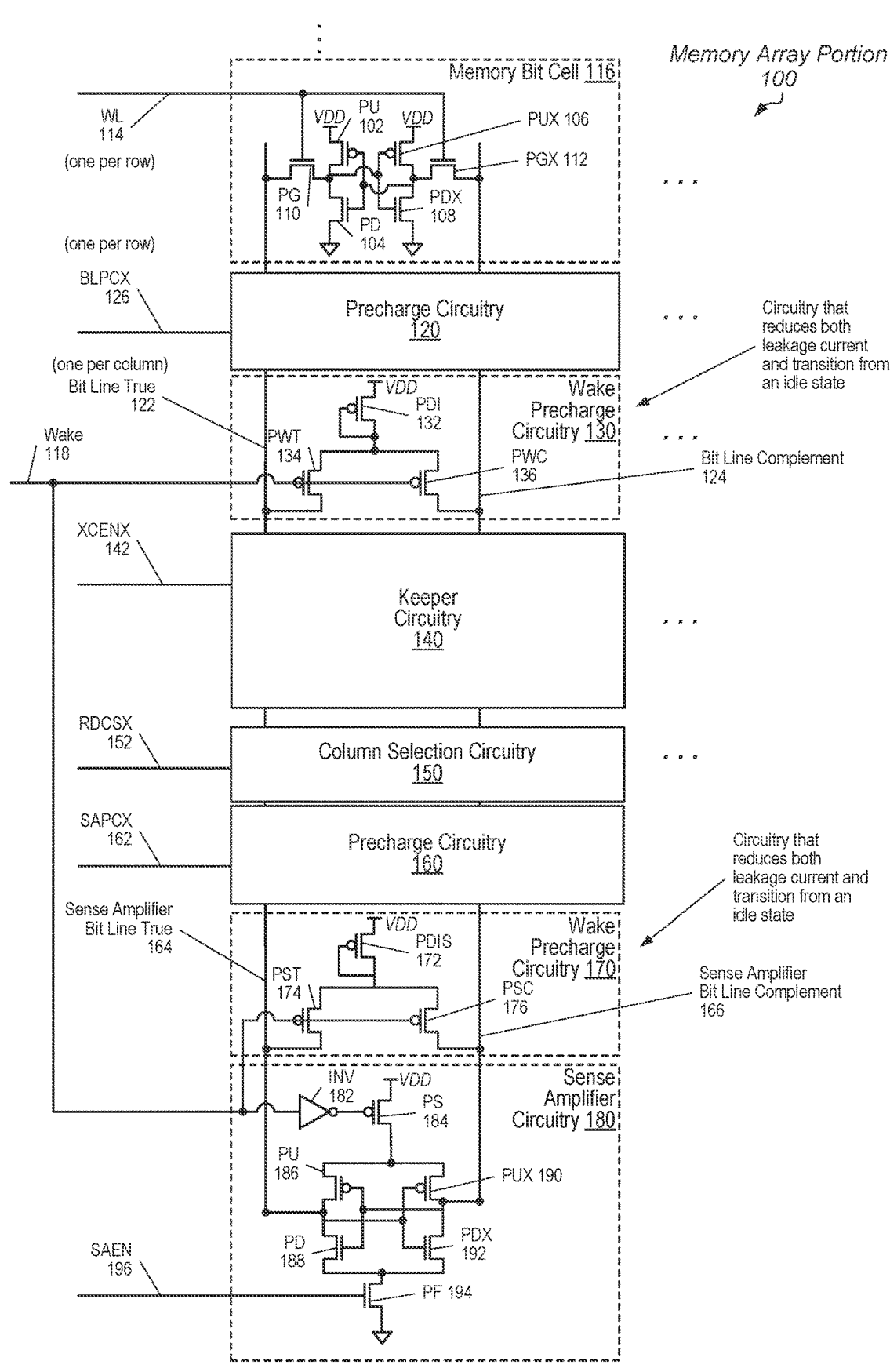
FIG. 1 is a generalized diagram of a memory array portion used in a memory array that reduces both leakage current and a transition from an idle state.

While the invention is susceptible to various modifications and alternative forms, specific implementations are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Apparatuses and methods for efficiently designing memory arrays in semiconductor dies are contemplated. A memory array (or array) utilizes memory bit cells arranged as multiple rows and multiple columns. In various implementations, the memory array utilizes wake pre-charge circuitry to reduce both leakage current and a transition from an idle state. When control circuitry of the memory array determines that there are no immediate upcoming read accesses or write accesses, the control circuitry disables bit line pre-charge circuitry of bit lines of one or more columns of the array. However, the control circuitry enables wake pre-charge circuitry to charge the bit lines to an idle voltage level equal to a difference between the power supply voltage level and a threshold voltage of a transistor. When the control circuitry determines at least one read access or write access is pending, the control circuitry transitions the memory array from the idle state to an active state. The control circuitry disables the wake pre-charge circuitry and enables the bit line pre-charge circuitry. The amount of voltage difference to charge the bit lines from the idle voltage level to the power supply reference voltage level, and the corresponding amount of current to cause the voltage difference, is small. Therefore, the amount of time to perform the pre-charge is relatively small, and the latency is small for the transition from the idle state to the active state. Further details of the memory array utilizing the wake pre-charge circuitry are provided in the following description of FIGS. 1-10.

Turning now to FIG. 1, a generalized block diagram is shown of a memory array portion 100 used in a memory array that reduces both leakage current and a transition from an idle state. The memory array portion 100 illustrates circuitry within a column of one or more columns of a memory array. The memory array includes multiple memory bit cells, such as memory bit cell 116, arranged as multiple rows and multiple columns. Here, a single column is shown, but in various implementations, multiple columns are connected to the column selection circuitry 150. In addition, in various implementations, the shown column includes one or more memory bit cells located above the memory bit cell 116, each with its own word line (WL). Each of these one or more memory bit cells located above the memory bit cell 116, each with its own word line (WL), is an additional row of the memory array.

The memory array portion 100 includes the memory bit cell 116 with precharge (or pre-charge) circuitry 120, wake pre-charge circuitry 130, and keeper circuitry 140. In some implementations, the memory array portion 100 includes multiple instantiations of each of these components 116-140, each within a corresponding column of the memory array. The memory array portion 100 also includes the column selection circuitry 150, the pre-charge circuitry 160, wake pre-charge circuitry 170, and sense amplifier 180.

Data storage in the memory bit cell 116 uses a variation of the six-transistor (6T) random access memory (RAM) cell. In other implementations, another one of various types of RAM cells is used. In the illustrated implementation, the p-type transistors PU 102 and PUX 106 and the n-type transistors PD 104 and PDX 108 form a feedback loop such as back-to-back (or cross coupled) inverters. As used herein, a "transistor" is also referred to as a "semiconductor device" or a "device." The memory array portion 100 uses p-type metal oxide semiconductor (PMOS) field effect transistors FETS (or pfets) in addition to n-type metal oxide semiconductor (NMOS) FETS (or nfets). In some implementations, the devices (or transistors) in the memory array portion 100 are planar devices. In other implementations, the devices (or transistors) in the memory array portion 100 are non-planar devices. Examples of non-planar transistors are tri-gate transistors, fin field effect transistors (FETs), and gate all around (GAA) transistors.

The cross coupled inverters provided by the devices 102-108 provide data storage as a latching element for two values. The n-type device PG 110 is a pass gate that provides access to a first value stored by the cross coupled inverters. The first value is stored on the node connected to the drain terminals of the p-type device PU 102 and the n-type device PD 104. The second value is stored on the node connected to the drain terminals of the p-type device PUX 106 and the n-type device PDX 108. The n-type device PGX 112 is a pass gate that provides access to the second value stored by the cross coupled inverters. The first value and the second value are complementary values with respect to one another.

When the pass gates (n-type devices 110 and 112) are enabled by the word line (WL) 114 connected to the gate terminals of the pass gates 110 and 112, the bit line true (BTL) 122 and the bit line (BLC) 124 are connected to the storage nodes of the latching element of the memory bit cell 116. The WL 114, BLT 122 and the BLC 124 are used for read operations. In some implementations, the WL 114, BLT 122 and the BLC 124 are also used for write operations although the write data latches and write data drivers are not shown for ease of illustration. In other implementations, a separate write word line and separate write bit lines are used for write operations, which increases the number of ports of the memory bit cell 116.

The details of the circuitry of the pre-charge circuitry 120, the keeper circuitry 140, the column select circuitry 150, and the pre-charge circuitry 160 are provided in the later description of memory array portion 200 (of FIG. 2). As an overview of the operation, the control signal BLPCX (bit line pre-charge complemented) 126 determines when the pre-charge circuitry 120 is enabled. Prior to the read operation, the control signal BLPCX 126 enables the pre-charge circuitry 120 to charge the BLT 122 and the BLC 124 to the power supply voltage reference level indicated as "VDD." During the read operation, the control signal BLPCX 126 disables the pre-charge circuitry 120 to allow the selected memory bit cell, such as memory bit cell 116, to generate voltage levels on the BLT 122 and the BLC 124.

In a similar manner, the control signal SAPCX (sense amplifier pre-charge complemented) 162 determines when the pre-charge circuitry 160 is enabled. Prior to the read operation, the control signal SAPCX 162 enables the pre-charge circuitry 160 to charge the sense amplifier bit line true (SABLT) 164 and the sense amplifier bit line complement (SABLC) 166 to the power supply voltage reference level. During the read operation, the control signal SAPCX 162 disables the pre-charge circuitry 160 to allow the selected memory bit cell, such as memory bit cell 116, to generate voltage levels on the SABLT 164 and the SABLC 166. The control signal read column select complement (RDCSX) 152 determines when the column selection circuitry 150 is enabled and connects the BLT 122 to the SABLT 164 and connects the BLC 124 to the SABLC 166.

The control signal XCENX 142 determines when the keeper circuitry 140 is enabled. The keeper circuitry 140 is used to maintain one of the BLT 122 and the BLC 124 at the power supply voltage reference level (VDD) after the other one of the BLT 122 and the BLC 124 has reduced to a voltage level equal to or less than the different between the power supply voltage reference level and a threshold voltage of a transistor (VDD−$V_t$). Without the keeper circuitry 140, during write operations or relatively low frequency read operations and prior to the sense amplifier circuitry 180 being enabled, it is possible that the bit line of the BLT 122 and the BLC 124 intended to be at the power supply voltage reference level (VDD) has its voltage level reduce to any voltage level between (VDD−$V_t$) and the ground reference level due to leakage currents. The keeper circuitry 140 prevents this reduction.

The control signal sense amplifier enable (SAEN) 196 determines when the sense amplifier circuitry 180 is enabled. The p-type transistors PU 186 and PUX 190 and the n-type transistors PD 188 and PDX 192 form a feedback loop such as back-to-back (or cross coupled) inverters. The n-type device PF 194 is a footer device that, when enabled by the control signal SAEN 196, connects the ground voltage reference level to the remainder of the circuitry of the sense amplifier circuitry 180. Similarly, the p-type device PS 184, when enabled by an inverted version of the control signal wake 118, connects the power supply voltage reference level to the remainder of the circuitry of the sense amplifier circuitry 180. The inverter 182 receives the control signal wake 118 and sends the complemented value of the control signal wake 118 to the gate terminal of the p-type device PS 184.

During a read operation, control circuitry of the memory array generates a Boolean logic high value on each of SAEN 196 and wake 118. In addition, the control circuitry generates a Boolean logic low value on RDCSX 152 of columns selected for the read operation. For columns that are not selected for the read operation, the control circuitry generates a Boolean logic high value on RDCSX 152. In contrast, during an idle state when the control circuitry determines that there are no immediate upcoming read accesses or write accesses, the control circuitry generates a Boolean logic low value on each of SAEN 196 and wake 118. In addition, the control circuitry generates a Boolean logic high value on RDCSX 152 of each of the multiple columns.

The memory array that uses the memory array portion 100 also includes other circuitry (not shown) such as row decoders and column decoders for selecting particular rows and columns to access for read operations and write operations. This other circuitry also includes latches for storing read operation results and write access data. As described earlier, in some implementations, the devices (or transistors) in the memory array portion 100 are planar devices. In other implementations, the devices (or transistors) in the memory array portion 100 are non-planar devices. These devices are capable of conducting leakage current even when disabled. For example, reverse-bias p-n junction exists due to minority carriers' diffusion near the depletion region and due to electron-hole pair generation in depletion region of reverse-bias junction. Weak inversion current occurs when gate voltage is lower than threshold voltage.

In addition to the above causes of leakage current, drain induced barrier lowering (DIBL) current exists when source's potential barrier is reduced as a result of the drain's depletion region interacts with the source. The existence of DIBL will lower the threshold voltage. Gate-induced drain lowering (GIDL) current occurs in high electric field between gate and drain, and it also occurs along the channel width between gate and drain. Another leakage current mechanism, punch-through, occurs when drain and source depletion regions touch deep in the channel. Narrow-width current arises when the channel length is reduced to less than $0.5 \mu m$. Gate-oxide tunnelling current occurs when the oxide layer is made very thin and also causes gate leakage current tunnelling through oxide bands. Finally, hot-carrier injection occurs when hot carriers is injected into the oxide.

To combat leakage current without adding further delay to a transition from an idle state, the wake pre-charge (or pre-charge) circuitry 130 pre-charges each of the BLT 122 and the BLC 124 to an idle voltage level equal to a difference between the power supply voltage level and a threshold voltage of a transistor, or $(VDD-V_t)$. Therefore, a voltage difference between voltage levels on a source terminal and a drain terminal of either of the pass gates PG 110 and PGX 112 is lowered from VDD to $(VDD-V_t)$. In addition, when the memory array portion 100 is transitioning from an idle state where control circuitry (not shown) does not expect any read accesses or write accesses to an active state where the control circuitry expects at least one read access or write access, pre-charging the BLT 122 and the BLC 124 from $(VDD-V_t)$ to VDD has a relatively small latency.

The wake pre-charge circuitry 130 includes the diode-connected p-type device PDI 132 and the two p-type devices PWT 134 and PWC 136. The diode-connected p-type transistor PDI 132, receives, on a source terminal, the power supply reference voltage level VDD. Source terminals of the two p-type devices PWT 134 and PWC 136 receive the idle voltage level on a drain terminal of PDI 132. Gate terminals of the two p-type devices PWT 134 and PWC 136 receive the control signal wake 118. If the control signal wake 118 does not indicate the memory array is entering an idle state, but rather remaining in an active state, then the control signal wake 118 continues to disable the two p-type devices PWT 134 and PWC 136. For example, control circuitry generates a Boolean high value for wake 118.

However, if the control circuitry determines that the memory array is entering the idle state, then the control circuitry generates a Boolean low value for wake 118 signal, which enables the two p-type devices PWT 134 and PWC 136. The enabled p-type device PWT 134 conveys the idle voltage level $(VDD-V_t)$ from its source terminal to its drain terminal connected to BLT 122. Similarly, the enabled p-type device PR 136 conveys the idle voltage level $(VDD-V_t)$ from its source terminal to its drain terminal connected to BLC 124. Therefore, the wake pre-charge circuitry 130 reduces, for the corresponding memory array, both leakage current and a transition from the idle state. In a similar manner, the p-type devices PDIS 172, PST 174 and PSC 176 of the wake pre-charge circuitry 170 reduces, for the corresponding memory array, both leakage current and a transition from the idle state. The drain terminals of the two p-type devices PST 174 and PSC 176, however, are connected to the SABLT 164 and the SABLC 166, respectively.

Figure 2:
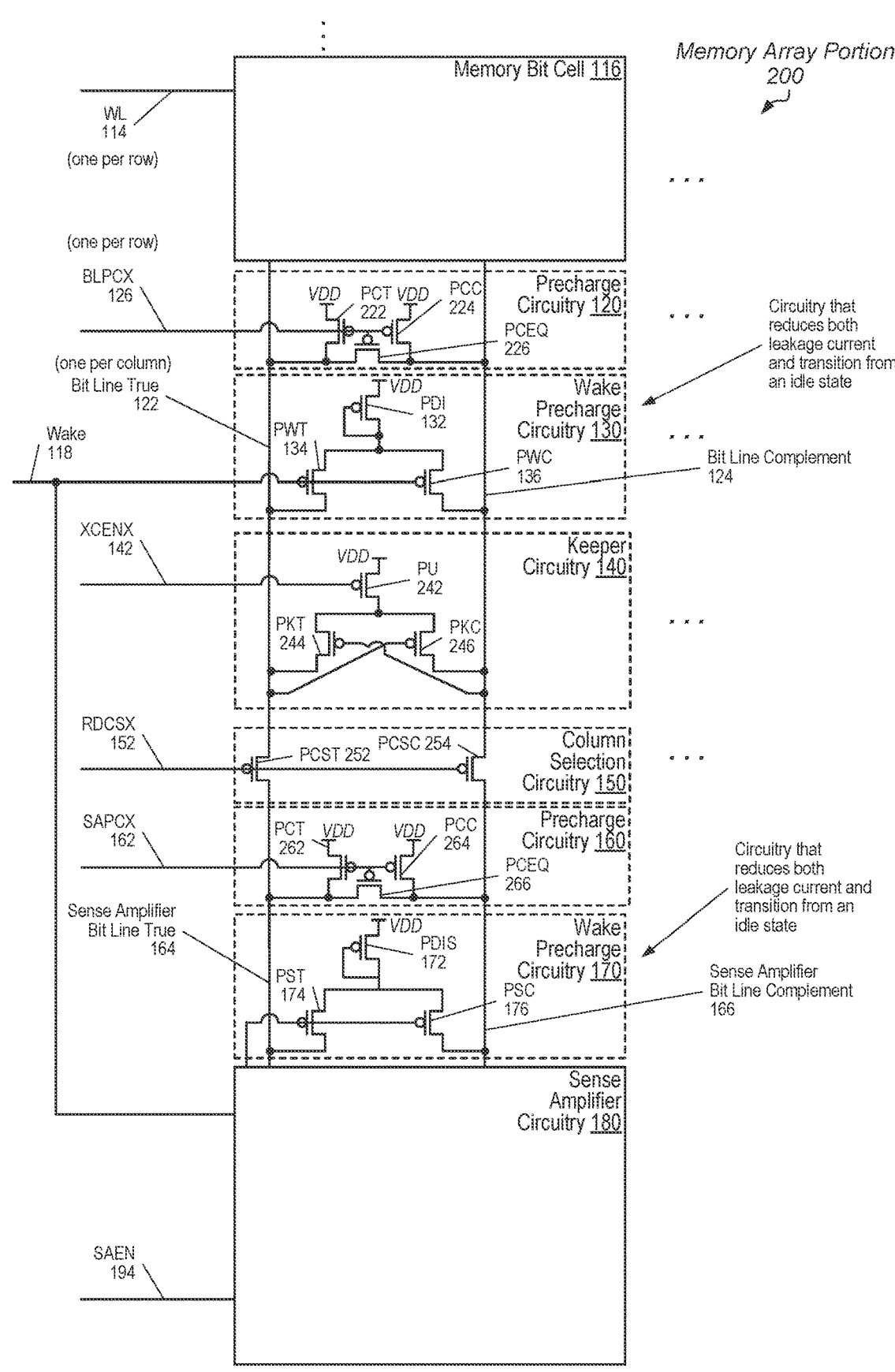
FIG. 2 is a generalized diagram of a memory array portion used in a memory array that reduces both leakage current and a transition from an idle state.

Referring to FIG. 2, a generalized block diagram is shown of a memory array portion 200 used in a memory array that reduces both leakage current and a transition from an idle state. Signals and circuitry described earlier are numbered identically. The memory array portion 200 can be the same memory portion of a memory arrays as memory array portion 100 (of FIG. 1) or another memory array portion connected to other columns of the memory array than the memory array portion 100. The memory array portion 200 includes the memory bit cell 116 with pre-charge circuitry 120, wake pre-charge circuitry 130, keeper circuitry 140, the column selection circuitry 150, the pre-charge circuitry 160, wake pre-charge circuitry 170, and sense amplifier 180. The wake pre-charge circuitry 130 and 170 reduces, for the corresponding memory array, both leakage current and a transition from the idle state.

As described earlier, the control signal BLPCX 126 determines when the pre-charge circuitry 120 is enabled. The pre-charge circuitry 120 includes the p-type devices PCT 222 and PCC 224 that receive the control signal BLPCX 126 on gate terminals and receive the power supply reference voltage VDD on source terminals. Whereas the drain terminal of the p-type device PCT 222 is connected to BLT 122, the drain terminal of the p-type device PCC 224 is connected to BLC 124. The p-type device PCEQ 226 receives the control signal BLPCX 126 on its gate terminal, has BLT 122 connected to one of its source/drain terminals, and has BLC 124 connected to the other one of its source/drain terminals. The pre-charge circuitry 160 includes the p-type devices the p-type devices PCT 262, PCC 264, and PCEQ 266 that are connected in a same configuration used in the pre-charge circuitry 120. As described earlier, the control signal SAPCX 162 determines when the pre-charge circuitry 160 is enabled.

The keeper circuitry 140 includes the p-type device PU 242, the p-type device PKT 244 and PKC 246. The p-type transistor PU 242, receives, on a source terminal, the power supply reference voltage level VDD. Source terminals of the two p-type devices PKT 244 and PKC 246 receive VDD on a drain terminal of PU 242 when it is enabled by the control signal XCENX 142. The gate terminal of the p-type device PKT 244 is connected to BTL 122. The gate terminal of the p-type device PKC 246 is connected to BTC 124. The column selection circuitry includes the p-type devices PCST 252 and PCSC 254. Each of these p-type devices receive the control signal RDCSX 152 on a gate terminal. Each column of memory array portion 200 has its own respective control signal RDCSX 152.

Figure 3:
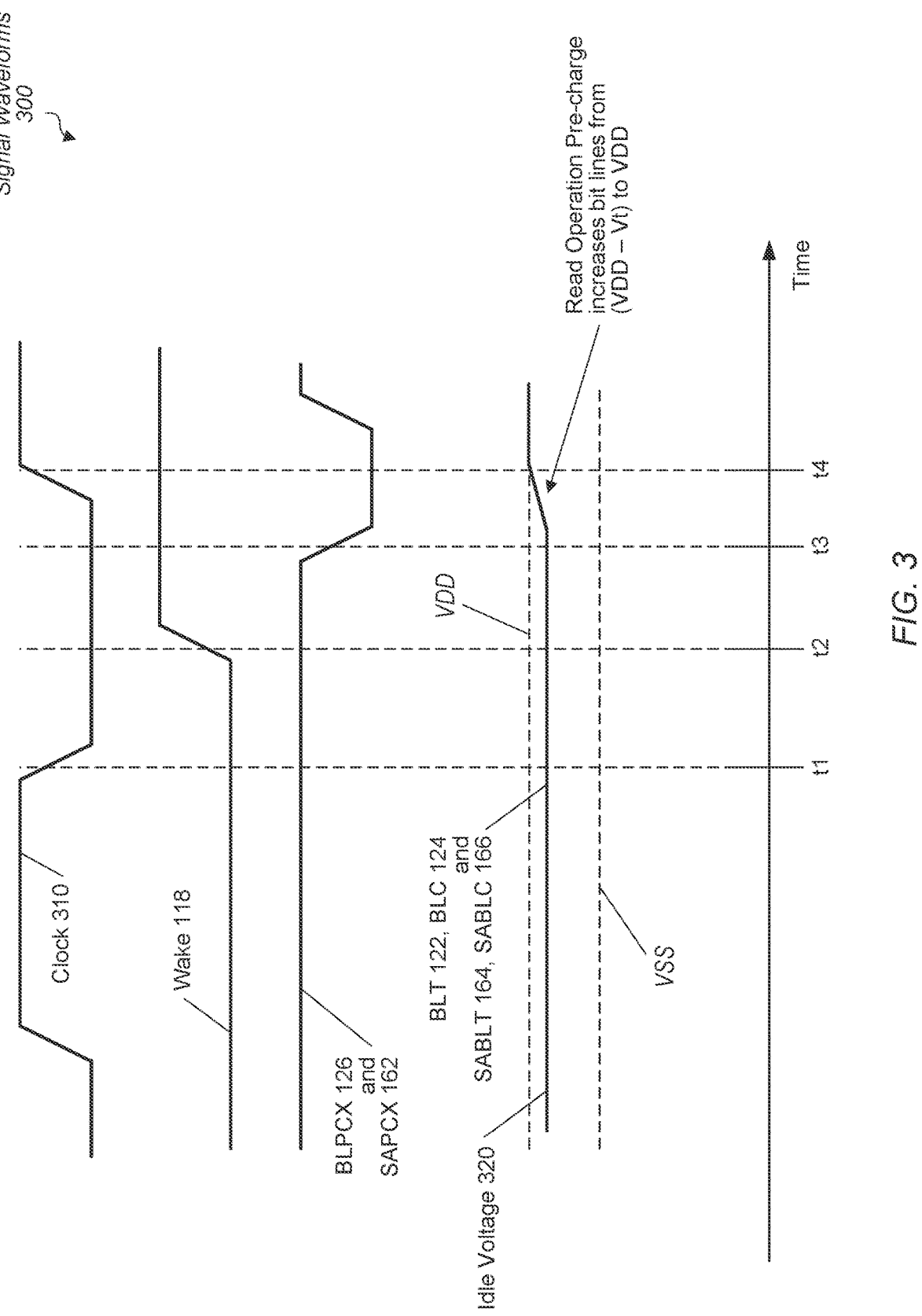
FIG. 3 is a generalized block diagram of signal waveforms of a memory array that reduces both leakage current and a transition from an idle state.

Referring to FIG. 3, a generalized block diagram is shown of signal waveforms 300 of a memory array that reduces both leakage current and a transition from an idle state. Signals and circuitry described earlier are numbered identically. The signal waveforms 300 illustrate different signal transitions over time such as a clock signal 310, the control signal wake 118, the control signals BLPCX 126 and SAPCX 162 (each having a same signal waveform), and the multiple bit lines BLT 122, BLC 124, SABLT 164 and SABLC 166. Control circuitry of a memory array determines that there are no immediate upcoming read accesses or write accesses during a time duration prior to the point-in-time t1 (or time t1). Therefore, the memory array is in an idle state. Accordingly, the control circuitry generates a Boolean logic low value for the control signal wake 118. Additionally, the control circuitry generates a Boolean logic high value for the control signals BLPCX 126 and SAPCX 162. As a result, wake pre-charge circuitry pre-charges the multiple bit lines BLT 122, BLC 124, SABLT 164 and SABLC 166 to an idle voltage level 320 equal to a difference between the power supply voltage level and a threshold voltage of a transistor, or (VDD−$V_t$). Examples of the wake pre-charge circuitry are wake pre-charge circuitry 130 and 170 of memory array portions 100-200 (of FIGS. 1-2). During the duration of time prior to t1 (and between t1 and t3), leakage currents of the memory array are reduced due to the small difference between the idle voltage level 320 and VDD.

When the control circuitry determines at least one read access or write access is pending, the control circuitry transitions the memory array from the idle state to an active state after time t1. For example, the control circuitry generates a Boolean logic high value for the control signal wake 118 and Boolean logic low values for the control signals BLPCX 126 and SAPCX 162. These transitions occur at times t2 and t3, respectively. At time t4, pre-charge circuitry pre-charges the multiple bit lines BLT 122, BLC 124, SABLT 164 and SABLC 166 to the power supply reference voltage level VDD. Examples of the pre-charge circuitry are the pre-charge circuitry 120 and 160 of memory array portions 100-200 (of FIGS. 1-2). As shown, the amount of voltage difference from the idle voltage level 320 to VDD, and the corresponding amount of current to cause the voltage difference, is small. Therefore, the amount of time to perform the pre-charge is relatively small such as the approximate duration of time between times t3 and t4.

Figure 4:
FIG. 4 is a generalized block diagram of signal waveforms of a memory array that does not utilize wake pre-charge circuitry to reduce both leakage current and a transition from an idle state.

Referring to FIG. 4, a generalized block diagram is shown of signal waveforms 400 of a memory array that does not utilize wake pre-charge circuitry to reduce both leakage current and a transition from an idle state, but utilizes floating bit lines to reduce leakage current. Signals and circuitry described earlier are numbered identically. The signal waveforms 400 illustrate different signal transitions over time such as a clock signal 410, the control signal BLPCX 126, and the multiple bit lines BLT 122 and BLC 124. Control circuitry of a memory array determines that there are no immediate upcoming read accesses or write accesses during a time duration prior to the point-in-time t1 (or time t1). Therefore, the memory array is in an idle state. Accordingly, the control circuitry generates a Boolean logic high value for the control signal BLPCX 126. Without wake pre-charge circuitry and allowing the bit lines BLT 122 and BLC 124 to float, it is possible the that bit lines BLT 122 and BLC 124 discharge to the ground reference voltage level VSS as a worst case.

When the control circuitry determines at least one read access or write access is pending, the control circuitry transitions the memory array from the idle state to an active state after time t1. For example, the control circuitry generates a Boolean logic low value for the control signal BLPCX 126. This transition occurs at time t2. At time t3, pre-charge circuitry pre-charges the multiple bit lines BLT 122 and BLC 124 to the power supply reference voltage level VDD. Examples of the pre-charge circuitry are the pre-charge circuitry 120 and 160 of memory array portions 100-200 (of FIGS. 1-2). As shown, the amount of voltage difference from VSS to VDD, and the corresponding amount of current to cause the voltage difference, is large. Therefore, the amount of time to perform the pre-charge is relatively large such as the approximate duration of time between times t2 and t3.

Figure 5:
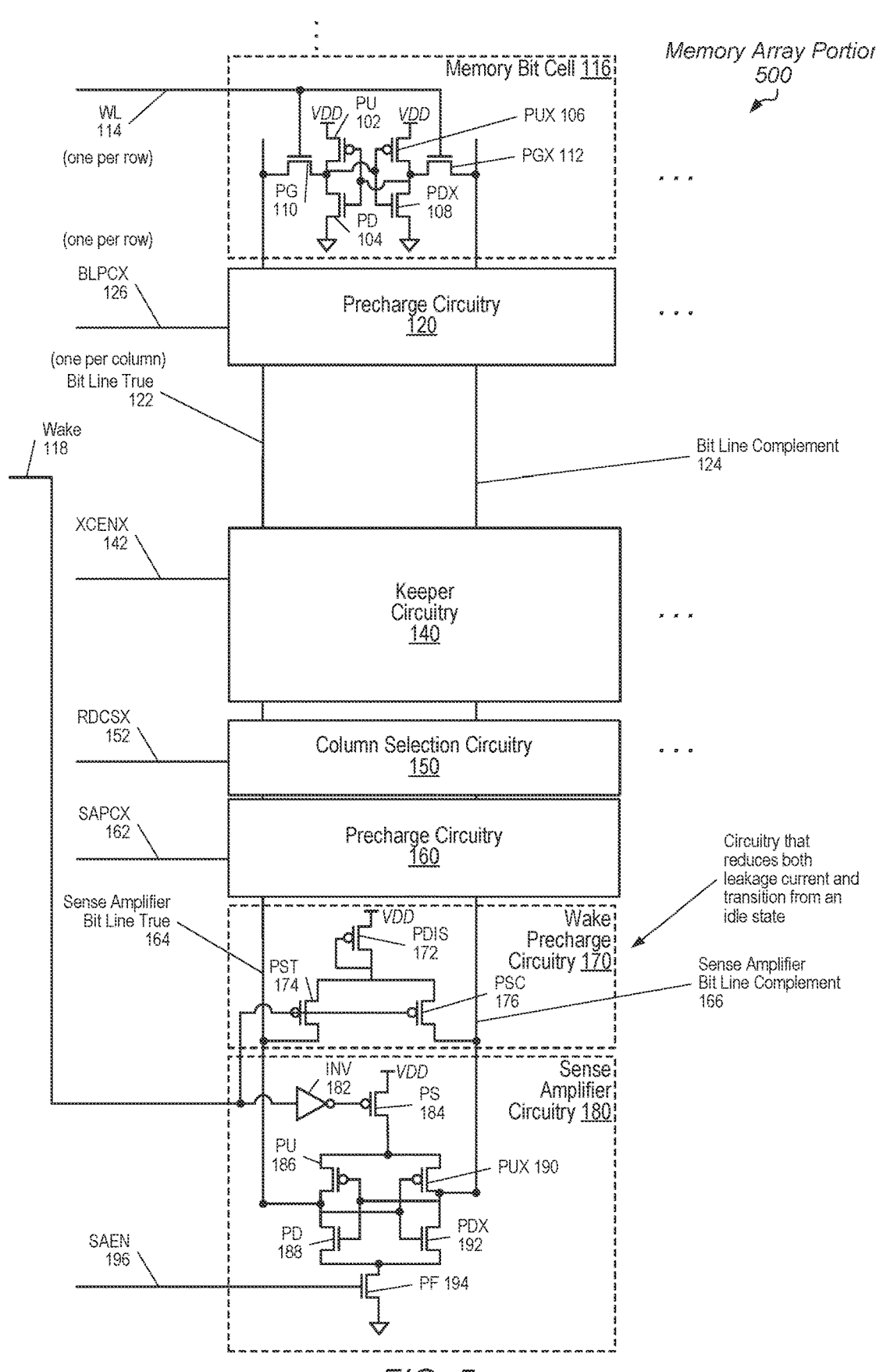
FIG. 5 is a generalized diagram of a memory array portion used in a memory array that reduces both leakage current and a transition from an idle state.

Referring to FIG. 5, a generalized block diagram is shown of a memory array portion 500 used in a memory array that reduces both leakage current and a transition from an idle state. Signals and circuitry described earlier are numbered identically. Similar to the memory array portions 100-200 (of FIGS. 1-2), a single column is shown, but in various implementations, multiple columns are connected to the column selection circuitry 150. The memory array portion 500 includes the same components as the memory array portions 100-200, but the memory array portion 500 does not include the wake pre-charge circuitry 130. Rather, the memory array portion 500 includes only the wake pre-charge circuitry 170 to pre-charge the SABLT 164, the SABLC 166, the BLT 122, and the BLC 124 to the idle voltage level equal to (VDD−$V_t$).

Similar to the memory array portions 100-200, during an idle state when the control circuitry determines that there are no immediate upcoming read accesses or write accesses, the control circuitry generates a Boolean logic low value on each of SAEN 196 and wake 118. However, in contrast to the memory array portions 100-200, the control circuitry generates a Boolean logic low value on RDCSX 152 of each of the multiple columns. Therefore, for each column of the memory array portion 500 during an idle state, SABLT 164 is connected to BLT 122. Additionally, SABLC 166 is connected to BLC 124. Accordingly, the p-type device PST 174 of the wake pre-charge circuitry 170 pre-charges the entire capacitance of the combination of the metal traces of SABLT 164 and BLT 122. Similarly, the p-type device PSC 176 of the wake pre-charge circuitry 170 pre-charges the entire capacitance of the combination of the metal traces of SABLC 166 and BLC 124.

Figure 6:
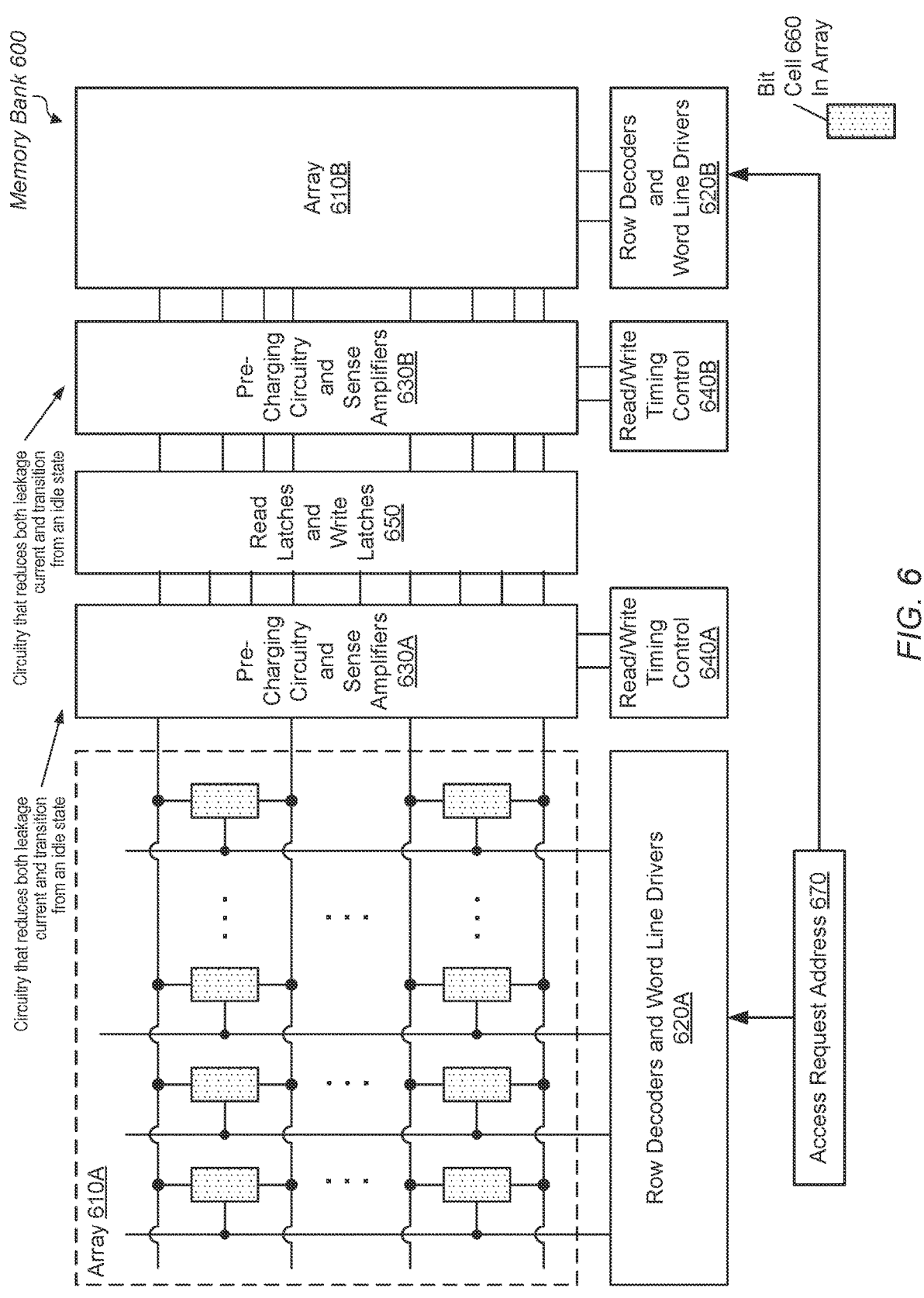
FIG. 6 is a generalized block diagram of a memory bank that utilizes wake pre-charge circuitry to reduce both leakage current and a transition from an idle state.

Turning now to FIG. 6, a generalized block diagram is shown of a memory bank 600 that utilizes wake pre-charge circuitry to reduce both leakage current and a transition from an idle state. In various implementations, a memory is organized as multiple memory banks, and a memory macro block includes both a left bank and a right bank. In some implementations, the bank 600 is one of the left bank or the right bank of the memory macro block. Although the terms "left," "right," "horizontal," "vertical," "top," and "bottom" are used to describe the memory banks, it is noted that the meaning of the terms can change as the memory bank 600 is rotated or flipped. As shown, the memory bank 600 includes arrays 610A-610B, row decoders 620A-620B, pre-charging circuitry and sense amplifiers 630A-630B between the arrays 610A-610B, read and write timing control logic 640A-640B, and read latches and write latches in block 650. It is noted that, in some implementations, multiple banks are accessed concurrently in a same clock cycle or a same pipeline stage. The access includes one of a read access and a write access. In such implementations, bank address decoders select the corresponding banks to access.

In various implementations, each of the blocks 610A-610B, 620A-620B, 630A-630B, 640A-640B and 650 in the memory bank 600 is communicatively coupled to another one of the blocks. For example, direct connections are used wherein routing occurs through another block. Alternatively, staging of signals is done in an intermediate block. In various implementations, each of the arrays 610A-610B includes multiple memory bit cells 660 arranged in a tiled format. Here, the rows are aligned with the tracks used for the routing of the word lines of the array such as in the vertical direction in the illustrated implementation. The columns are aligned with the tracks used for the routing of the bit lines of the array such as in the horizontal direction in the illustrated implementation.

In various implementations, the circuitry of the pre-charging circuitry and sense amplifiers 630A (or block 630A) includes the circuitry of one or more of the memory array portions 100, 200, and 500 (of FIGS. 1-2 and 5). Therefore, the block 630A includes circuitry that reduces both leakage current and a transition from an idle state. In various implementations, the block 630B is an instantiated copy of the block 630A, and additionally, the array 610B is an instantiated copy of the array 610A.

The row decoders and word line drivers in blocks 620A-620B receive address information corresponding to an access request. For example, each of the blocks 620A-620B receives the information provided by the access request address 670. Each one of the blocks 620A-620B selects a particular row, or entry, of the multiple rows in an associated one of the arrays 620A-620B. In some implementations, the blocks 620A-620B use an index portion of the address 670 for selecting a given row, or entry, in an associated one of the arrays 620A-620B. Each row, or entry, stores one or more memory lines.

In the implementation shown, the rows, or entries, in arrays 620A-620B are arranged in a vertical orientation. However, in other implementations, a horizontal orientation is used for storage of the memory lines. For write access requests, the write latches are located in block 650. The write data is driven into the arrays 610A-610B. The timing control logic 640A-640B updates the write latches with new data in block 650 and sets up the write word line driver logic. The write data is written into a row of bit cells that is selected by an associated one of the blocks 620A-620B. In some implementations, pre-charge circuitry is included in block 650.

For read access requests, the block 650 is used to pre-charge the read bit lines routed to the arrays 610A-610B. The timing circuitry in blocks 640A-640B is used for pre-charging and setting up the circuitry in the blocks

630A-630B. The timing circuitry 640A-640B sets up the read word line driver logic. One of the row decoders 620A-620B selects a row to read out data, which will be provided on read bit lines that are sensed by the sense amplifiers. The read latches capture the read data.

Regarding the below description of methods 700-900 (of FIGS. 7-9), computer program instructions are processed. In various implementations, the instructions are compiled, fetched from memory, decoded, and executed. In some implementations, one or more instructions are pre-decoded. During the processing of instructions, a variety of types of data are stored in multiple cells of a memory arranged as rows and columns. Examples of the variety of types of data are at least the instructions, pre-decoded instructions, user source data, intermediate result data, final result data, control and status information, and so forth. In some implementations, the memory is a cache in a cache memory subsystem. In other implementations, the memory is a register file or other on-die storage of data.

Referring to FIG. 7, a generalized block diagram is shown of a method 700 for efficiently reducing, in a memory array, both leakage current and a transition from an idle state. For purposes of discussion, the steps in this implementation (as well as for FIGS. 8-9) are shown in sequential order. However, in other implementations some steps occur in a different order than shown, some steps are performed concurrently, some steps are combined with other steps, and some steps are absent.

Data is stored in a memory array that includes an array of memory bit cells arranged as a plurality of rows and a plurality of columns (block 702). If control circuitry of the memory array does not determine that the array is entering an idle state ("no" branch of the conditional block 704), then the circuitry of the memory array continues to process received read accesses and write accesses (block 706). However, if the control circuitry of the memory array determines that the array is entering an idle state ("yes" branch of the conditional block 704), then the control circuitry disables a sense amplifier and disconnect the sense amplifier from one or more columns of the array (block 708).

The control circuitry of the memory array disables first pre-charge circuitry of the sense amplifier bit lines used during memory accesses of the array (block 710). The control circuitry disables second pre-charge circuitry of bit lines of one or more columns of the array (block 712). The control circuitry enables third pre-charge circuitry to charge the sense amplifier bit lines to an idle voltage level equal to a difference between the power supply voltage level and a threshold voltage of a transistor (block 714). The control circuitry enables fourth pre-charge circuitry to charge the bit lines of the one or more columns of the array to the idle voltage level (block 716).

Turning now to FIG. 8, a generalized block diagram is shown of a method 800 for efficiently reducing, in a memory array, both leakage current and a transition from an idle state. Data is stored in a memory array that includes an array of memory bit cells arranged as a plurality of rows and a plurality of columns (block 802). If control circuitry of the memory array does not determine that the inactive array is entering an active state ("no" branch of the conditional block 804), then the circuitry of the memory array maintains the idle state until memory accesses arrive for processing (block 806). However, if the control circuitry of the memory array determines that the idle array is entering an active state ("yes" branch of the conditional block 804), then the control circuitry disables first pre-charge circuitry of sense amplifier bit lines (block 808). The control circuitry of the memory array disables second pre-charge circuitry of bit lines of one or more columns of the array (block 810).

The control circuitry enables third pre-charge circuitry to charge the sense amplifier bit lines to a power supply voltage level from an idle voltage level equal to a difference between the power supply voltage level and a threshold voltage of a transistor (block 812). The control circuitry enables fourth pre-charge circuitry to charge the bit lines of the one or more columns of the array to the power supply voltage level from the idle voltage level (block 814). The control circuitry enables a header device of the sense amplifier and reconnect the sense amplifier to one or more columns of the array (block 816). Afterward, when a differential voltage is formed between the two bit lines, the control circuitry enables the sense amplifier such as asserting an enable signal of the sense amplifier.

Figure 9:
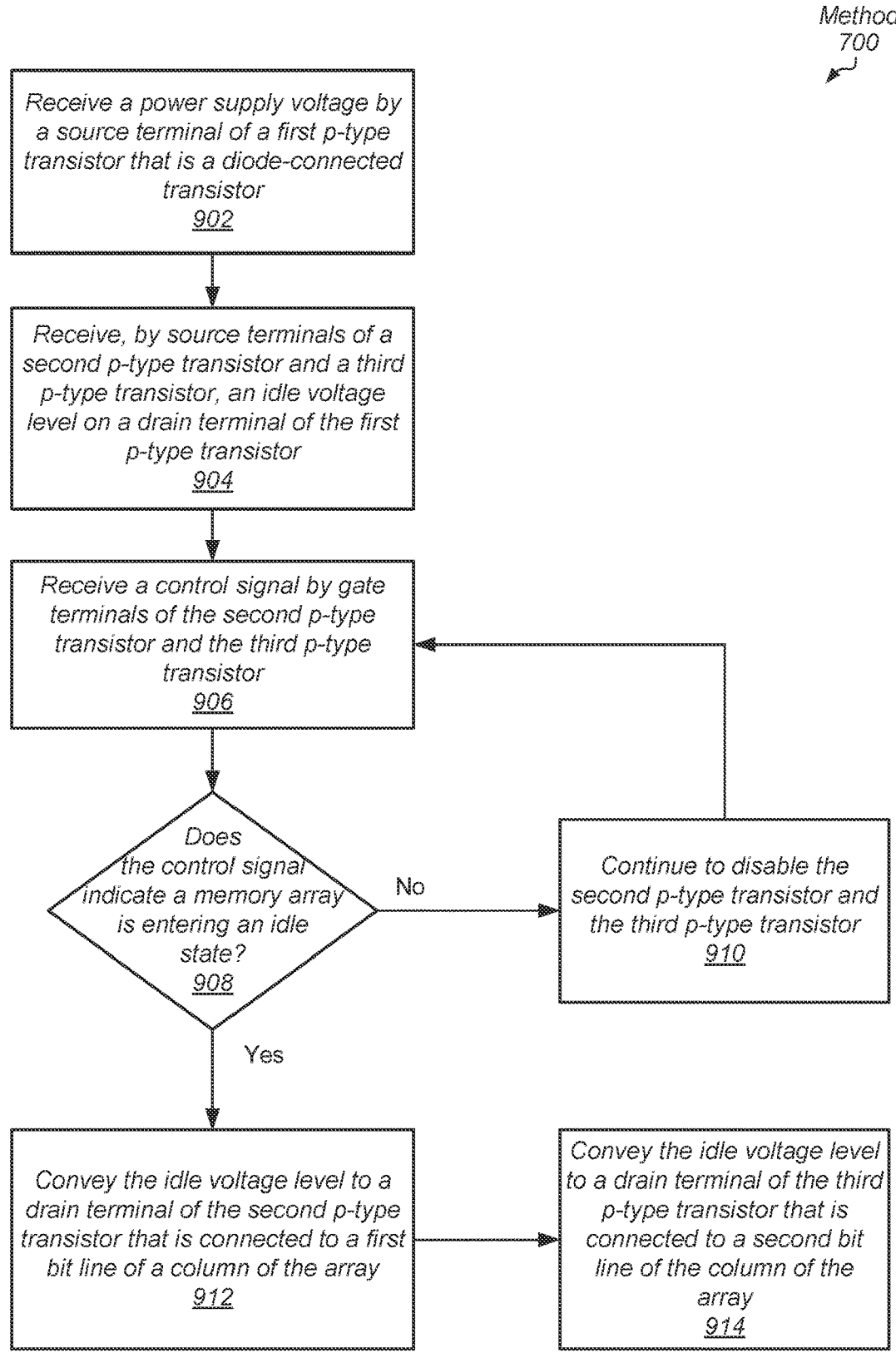
FIG. 9 is a generalized block diagram is shown of a method for efficiently reducing, in a memory array, both leakage current and a transition from an idle state.

Referring to FIG. 9, a generalized block diagram is shown of a method 900 for efficiently reducing, in a memory array, both leakage current and a transition from an idle state. Pre-charge wake circuitry is connected to both a true bit line and a complemented bit line of a column of a memory array. The pre-charge wake circuitry includes three p-type devices. A first p-type transistor, which is a diode-connected p-type transistor, receives, on a source terminal, a power supply reference voltage level (block 902). Source terminals of a second p-type transistor and a third p-type transistor receive an idle voltage level on a drain terminal of the first p-type transistor, which is the diode-connected p-type transistor (block 904).

Gate terminals of the second p-type transistor and the third p-type transistor receive a control signal (block 906). If the control signal does not indicate a memory array is entering an idle state ("no" branch of the conditional block 908), then the control signal continues to disable the second p-type transistor and the third p-type transistor (block 910). However, if the control signal indicates the memory array is entering an idle state ("yes" branch of the conditional block 908), then the control signal enables the second p-type transistor and the third p-type transistor, which causes the idle voltage level to be conveyed to a drain terminal of the second p-type transistor that is connected to a first bit line of a column of the array (block 912). In addition, enabling the third p-type transistor causes the idle voltage level to be conveyed to a drain terminal of the third p-type transistor that is connected to a second bit line of the column of the array (block 914).

Figure 10:
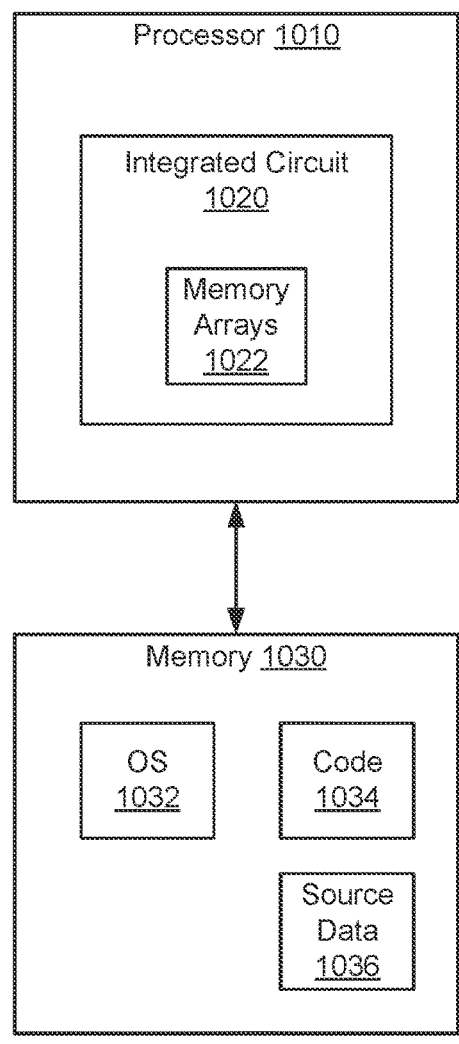
FIG. 10 is a generalized block diagram of a computing system that utilizes wake pre-charge circuitry to reduce both leakage current and a transition from an idle state.

Referring to FIG. 10, a generalized block diagram is shown of a computing system 1000 that utilizes wake pre-charge circuitry to reduce both leakage current and a transition from an idle state. The computing system 1000 includes the processor 1010 and the memory 1030. Interfaces, such as a memory controller, a bus, or a communication fabric, one or more phased locked loops (PLLs) and other clock generation circuitry, a power management unit, and so forth, are not shown for ease of illustration. It is understood that in other implementations, the computing system 1000 includes one or more of other processors of a same type or a different type than processor 1010, one or more peripheral devices, a network interface, one or more other memory devices, and so forth. In some implementations, the functionality of the computing system 1000 is incorporated on a system on chip (SoC). In other implementations, the functionality of the computing system 1000 is incorporated on a peripheral card inserted in a motherboard. The computing system 1000 is used in any of a variety of computing devices such as a desktop computer, a tablet computer, a laptop, a smartphone, a smartwatch, a gaming console, a personal assistant device, and so forth.

The processor 1010 includes hardware such as circuitry. For example, the processor 1010 includes at least one integrated circuit 1020. The integrated circuit 1020 includes memory arrays 1022 where one or more of these memory arrays 1022 includes the circuitry of one or more of the memory array portions 100, 200, and 500 (of FIGS. 1-2 and 5). Therefore, the one or more of these memory arrays 1022 includes circuitry that reduces both leakage current and a transition from an idle state. In some implementations, the processor 1010 includes one or more processing units. In some implementations, each of the processing units includes one or more processor cores capable of general-purpose data processing, and an associated cache memory subsystem. In such an implementation, the processor 1010 is a central processing unit (CPU). In another implementation, the processing cores are compute units, each with a highly parallel data microarchitecture with multiple parallel execution lanes and an associated data storage buffer. In such an implementation, the processor 1010 is a graphics processing unit (GPU), a digital signal processor (DSP), or other.

In some implementations, the memory 1030 includes one or more of a hard disk drive, a solid-state disk, other types of flash memory, a portable solid-state drive, a tape drive and so on. The memory 1030 stores an operating system (OS) 1032, one or more applications represented by code 1034, and at least source data 1036. Memory 1030 is also capable of storing intermediate result data and final result data generated by the processor 1010 when executing a particular application of code 1034. Although a single operating system 1032 and a single instance of code 1034 and source data 1036 are shown, in other implementations, another number of these software components are stored in memory 1030. The operating system 1032 includes instructions for initiating the boot up of the processor 1010, assigning tasks to hardware circuitry, managing resources of the computing system 1000 and hosting one or more virtual environments.

Each of the processor 1010 and the memory 1030 includes an interface unit for communicating with one another as well as any other hardware components included in the computing system 1000. The interface units include queues for servicing memory requests and memory responses, and control circuitry for communicating with one another based on particular communication protocols. The communication protocols determine a variety of parameters such as supply voltage levels, power-performance states that determine an operating supply voltage and an operating clock frequency, a data rate, one or more burst modes, and so on.

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R. CD-RW, DVD-R, DVD-RW, or Blu-Ray. Storage media further includes volatile or non-volatile memory media such as RAM (e.g., synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g., Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases, the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:

control circuitry;

pre-charge circuitry coupled to a plurality of bit lines of one or more columns of an array of memory bit cells; and a sense amplifier coupled to the plurality of bit lines; and wherein responsive to a transition of the array from an idle state to an active state, the control circuitry is configured to convey a first control signal to disable the pre-charge circuitry and enable a first portion of the sense amplifier.

2. The integrated circuit as recited in claim 1, wherein in response to entering an idle state of the array, the pre-charge circuitry is configured to pre-charge, using a power supply voltage level of the array of memory bit cells, the plurality of bit lines to a voltage level equal to a difference between the power supply voltage level and a threshold voltage of a transistor, wherein one or more bit cells of the array of memory bit cells store data as a voltage level equal to the power supply voltage level.

3. The integrated circuit as recited in claim 2, wherein the pre-charge circuitry comprises:

a diode-connected p-type transistor;

a first p-type transistor between the diode-connected p-type transistor and a first half of the plurality of bit lines configured to be enabled by assertion of the first control signal; and a second p-type transistor between the diode-connected p-type transistor and a second half different from the first half of the plurality of bit lines configured to be enabled by assertion of the first control signal.

4. The integrated circuit as recited in claim 1, wherein in response to entering an idle state of the array of memory bit cells, the control circuitry is configured to disable the first portion of the sense amplifier by conveying the first control signal as asserted to the sense amplifier.

5. The integrated circuit as recited in claim 4, wherein in further response to entering the idle state of the array of memory bit cells, the control circuitry is configured to disable a second portion of the sense amplifier by conveying a second control signal different from the first control signal to the sense amplifier.

6. The integrated circuit as recited in claim 1, wherein in further response to entering the active state of the array of memory bit cells, the control circuitry is configured to enable a second portion of the sense amplifier by conveying a second control signal different from the first control signal to the sense amplifier.

7. The integrated circuit as recited in claim 6, wherein the control circuitry is further configured to enable the first portion prior to enabling the second portion of the sense amplifier.

8. A method comprising:

storing data in an array of memory bit cells arranged as a plurality of rows and a plurality of columns, each configured to store data as a voltage level equal to a power supply voltage level; and responsive to a transition of the array from an idle state to an active state, conveying, by control circuitry, a first control signal to disable pre-charge circuitry coupled to a plurality of bit lines of one or more columns of the array of memory bit cells and enable a first portion of a sense amplifier coupled to the plurality of bit lines.

9. The method as recited in claim 8, wherein in response to entering an idle state of the array, the method further comprises pre-charging, by the pre-charge circuitry, using the power supply voltage level of the array of memory bit cells, the plurality of bit lines to a voltage level equal to a difference between the power supply voltage level and a threshold voltage of a transistor.

10. The method as recited in claim 9, further comprising pre-charging the plurality of bit lines of one or more columns of the array by:

a diode-connected p-type transistor;

a first p-type transistor between the diode-connected p-type transistor and a first half of the plurality of bit lines configured to be enabled by assertion of the first control signal; and a second p-type transistor between the diode-connected p-type transistor and a second half different from the first half of the plurality of bit lines configured to be enabled by assertion of the first control signal.

11. The method as recited in claim 8, wherein in response to entering an idle state of the array of memory bit cells, the method further comprises disabling, by the control circuitry, the first portion of the sense amplifier by conveying the first control signal as asserted to the sense amplifier.

12. The method as recited in claim 11, wherein in further response to entering the idle state of the array of memory bit cells, the method further comprises disabling, by the control circuitry, a second portion of the sense amplifier by conveying a second control signal different from the first control signal to the sense amplifier.

13. The method as recited in claim 11, wherein in further response to entering the active state of the array of memory bit cells, the method further comprises enabling, by the control circuitry, a second portion of the sense amplifier by conveying a second control signal different from the first control signal to the sense amplifier.

14. The method as recited in claim 13, further comprising enabling, by the control circuitry, the first portion prior to enabling the second portion of the sense amplifier.

15. A computing system comprising:
a memory comprising:
an array of memory bit cells arranged as a plurality of rows and a plurality of columns, each configured to store data as a voltage level equal to a power supply voltage level;
control circuitry;
pre-charge circuitry coupled to a plurality of bit lines of one or more columns of the array; and
a sense amplifier coupled to the plurality of bit lines; and
a processor configured to generate memory access requests targeting data stored in the memory; and
wherein:
in an idle state, the memory is configured to pre-charge the plurality of bit lines;
in an active state, the memory is configured to service the memory access requests; and
responsive to a transition of the array from the idle state to the active state, the control circuitry is configured to convey a first control signal to disable the pre-charge circuitry and enable a first portion of the sense amplifier.

16. The computing system as recited in claim 15, wherein in response to entering an idle state of the array, the pre-charge circuitry is configured to pre-charge, using the power supply voltage level of the array of memory bit cells, the plurality of bit lines to a voltage level equal to a difference between the power supply voltage level and a threshold voltage of a transistor.

17. The computing system as recited in claim 16, wherein the pre-charge circuitry comprises:
a diode-connected p-type transistor;
a first p-type transistor between the diode-connected p-type transistor and a first half of the plurality of bit lines configured to be enabled by assertion of the first control signal; and
a second p-type transistor between the diode-connected p-type transistor and a second half different from the first half of the plurality of bit lines configured to be enabled by assertion of the first control signal.

18. The computing system as recited in claim 15, wherein in response to entering an idle state of the array of memory bit cells, the control circuitry is configured to disable the first portion of the sense amplifier by conveying the first control signal as asserted to the sense amplifier.

19. The computing system as recited in claim 18, wherein in further response to entering the idle state of the array of memory bit cells, the control circuitry is configured to disable a second portion of the sense amplifier by conveying a second control signal different from the first control signal to the sense amplifier.

20. The computing system as recited in claim 15, wherein in further response to entering the active state of the array of memory bit cells, the control circuitry is configured to enable a second portion of the sense amplifier by conveying a second control signal different from the first control signal to the sense amplifier.

*  *  *  *  *